(12) United States Patent
Dumoulin

(10) Patent No.: US 6,288,541 B1
(45) Date of Patent: *Sep. 11, 2001

(54) MRI MEASUREMENT OF BLOOD VESSEL WALL COMPLIANCE

(75) Inventor: Charles Lucian Dumoulin, London (GB)

(73) Assignee: General Electric Company, Schenectady, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/378,934

(22) Filed: Aug. 23, 1999

(51) Int. Cl.[7] .................................................. G01V 3/00

(52) U.S. Cl. ............................................................ 324/306

(58) Field of Search .................................. 324/306, 309, 324/307

(56) References Cited

U.S. PATENT DOCUMENTS

| 4,995,394 | 2/1991 | Cline et al. |
|---|---|---|
| 5,233,298 | 8/1993 | Dumoulin. |
| 6,141,578 | * 10/2000 | Hardy ................................. 324/306 |

OTHER PUBLICATIONS

Aortic distensibility in patients with isolated hypercholesterolemia, coronary artery disease, or cardiac transplant, A.M. Dart, F. Lacombe, J.K. Yeoh, J.D. Cameron, G.L. Jennings, E. Laufer and D.S. Esmore, Lancet 1991; 338: 270–73.

Abnormal arterial flow pattern in untreated essential hypertension: possible link with the development of atherosclerosis, Christopher J.H. Jones, Donald R.J. Singer, Nicholas V. Watkins, Graham A. MacGregor and Colin G. Caro, Clinical Science (1990) 78, 431–435.

Effect of cigarette smoking on the pattern of arterial blood flow: Possible insight into mechanisms underlying the development of arteriosclerosis, C.G. Caro, M.J. Lever, K.H. Parker and P.J. Fish, The Lancet, Jul. 4, 1987.

SMRI 1989: Seventh Annual Meeting Program and Abstracts.

Correlation between Aortic Diameter and Vessel Wall Distensibility using a Non–Invasive NMR Method, Johns Hopkins University School of Medicine, Baltimore, MD and General Electric Corporate Research and Development, Schenectady, NY.

Quantitative Measurement of Velocity at Multiple Positions Using Comb Excitation and Fourier Velocity Encoding, C.L. Dumoulin, D.J. Doorly, and C.G. Caro, Copyright © by Williams & Wilkins.

* cited by examiner

Primary Examiner—Hezron Williams
Assistant Examiner—Dixomare Vargas
(74) Attorney, Agent, or Firm—Jill M. Breedlove; Douglas E. Stoner

(57) ABSTRACT

An MRI system repeatedly performs a pulse sequence during a time interval ΔT in which a surge of blood flows through a vessel whose compliance is to be measured. Two spaced-apart slices are simultaneously excited by each pulse sequence and the transverse magnetization is flow-encoded before an NMR signal is acquired in the presence of a readout gradient pulse. The change in phase of the NMR signal is used to detect when the wave arrives at each slice location, and from this information blood vessel compliance may be calculated.

19 Claims, 5 Drawing Sheets

MRI MEASUREMENT OF BLOOD VESSEL WALL COMPLIANCE

BACKGROUND OF THE INVENTION

The field of this invention is nuclear magnetic resonance imaging (MRI) methods and systems. More particularly, the invention relates to measurement of blood vessel wall compliance by measuring wave speed using an MRI system.

When a substance such as human tissue is subjected to a uniform magnetic field (polarizing field $B_0$) directed along the z-axis of a Cartesian coordinate system, the individual magnetic moments of the nuclear spins in the tissue attempt to align with this polarizing field and consequently precess about the polarizing field in random order at their characteristic Larmor frequency. If the substance, or tissue, is subjected to an excitation magnetic field (excitation field $B_1$) which is in the x-y plane and which is near the Larmor frequency, the net aligned moment $M_z$ may be rotated, or "tipped", into the x-y plane to produce a net transverse magnetic moment $M_t$. A signal is emitted by the excited spins after the excitation field $B_1$ is terminated, and may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

In addition to producing anatomic images, NMR signals can be produced which indicate the motion of spins. Such motion-encoded NMR signals rely upon the fact that an NMR signal produced by spins moving through a magnetic field gradient experiences a phase shift that is proportional to velocity. For flow that has a roughly constant velocity during the measurement cycle the change in phase of the NMR signal is given as follows:

$$\Delta\phi = \gamma M_1 v$$

where $M_1$ is the first moment of a bipolar, motion encoding magnetic field gradient, $\gamma$ is the gyromagnetic ratio and v is the velocity of the spins. To eliminate errors in this measurement due to phase shifts caused by other sources, it is common practice to perform the measurement at least twice with different magnetic field gradient moments as described in O'Donnell U.S. Pat. No. 4,609,872, issued Sep. 2, 1986 and assigned to the instant assignee. By performing two complete scans with different magnetic field gradient first moments and subtracting the measured phases in the reconstructed image at each location in the acquired data array, a phase map is produced which accurately measures the velocity of moving spins.

Blood vessel wall compliance is an important physiological parameter since it influences the load placed on the heart and is a predictor of coronary heart disease. Furthermore, compliance changes in association with certain risk factors are a predictor for atherosclerosis and may play a role in development of the disease. While aortic wall compliance is an important factor in diseases such as Marfan's syndrome, in general, changes in compliance of the aorta do not correlate well with changes in compliance of the smaller systemic vessels where most blood vessel disease is found.

Several methods have been used in the past to measure wave speed and blood vessel wall compliance, or distensibility, using magnetic resonance. These methods rely on measurement of the time-course of velocity at two different locations along a vessel. Wave speed is determined by measuring the time delay between a selected feature (e.g. the onset of flow) between the two stations. Compliance, or distensibility, D of the vessel can then be computed using the equation:

$$D = \frac{1}{\rho C^2} \quad (1)$$

where $\rho$ is the density of blood and C is the measured wave speed.

Unfortunately, all of the methods proposed to measure wave speed to date are either not well suited for measurement of wave speed in smaller blood vessels, or require relatively long acquisition times. Mohiaddin, et al. proposed a method in "Aortic Flow Wave Velocity: The Effect Of Age and Disease", *Proceedings of the Seventh Annual Meeting of the Society of Magnetic Resonance Imaging*, 7 (suppl 1): 119, 989, which relies upon the aortic arch traversing an imaging plane at two locations. The Mohiaddin et al. method, however, is limited to the aortic arch and is not suitable for measurement in relatively straight blood vessels. A method in which blood velocity is measured along the length of the aorta using m-mode MR imaging is disclosed in Cline et al. U.S. Pat. No. 4,995,394, issued Feb. 26, 1991 and assigned to the instant assignee, but it is not clear how well this method will work for smaller vessels because of geometric considerations. Comb excited Fourier velocity encoding as described in Dumoulin U.S. Pat. No. 5,233,298, issued Aug. 3, 1993 and assigned to the instant assignee, has been demonstrated to work well for the measurement of wave speed in peripheral vessels, although it would be desirable to further minimize examination times.

SUMMARY OF THE INVENTION

Compliance of a blood vessel is measured using an MRI system to acquire data from which the velocity of wave propagation along the blood vessel may be determined. A pulse sequence which may include a flow encoding gradient is repeatedly performed by the MRI system over an interval $\Delta T$ during which the wave propagates through two, spaced sections or "slices" that are simultaneously excited by the pulse sequence. The acquired NMR signals are transformed and used to detect the propagating wave arrival at each slice location, and from this information the wave velocity is calculated and used to determine blood vessel compliance.

DESCRIPTION OF THE PREFERRED EMBODIMENTS

Figure 1:
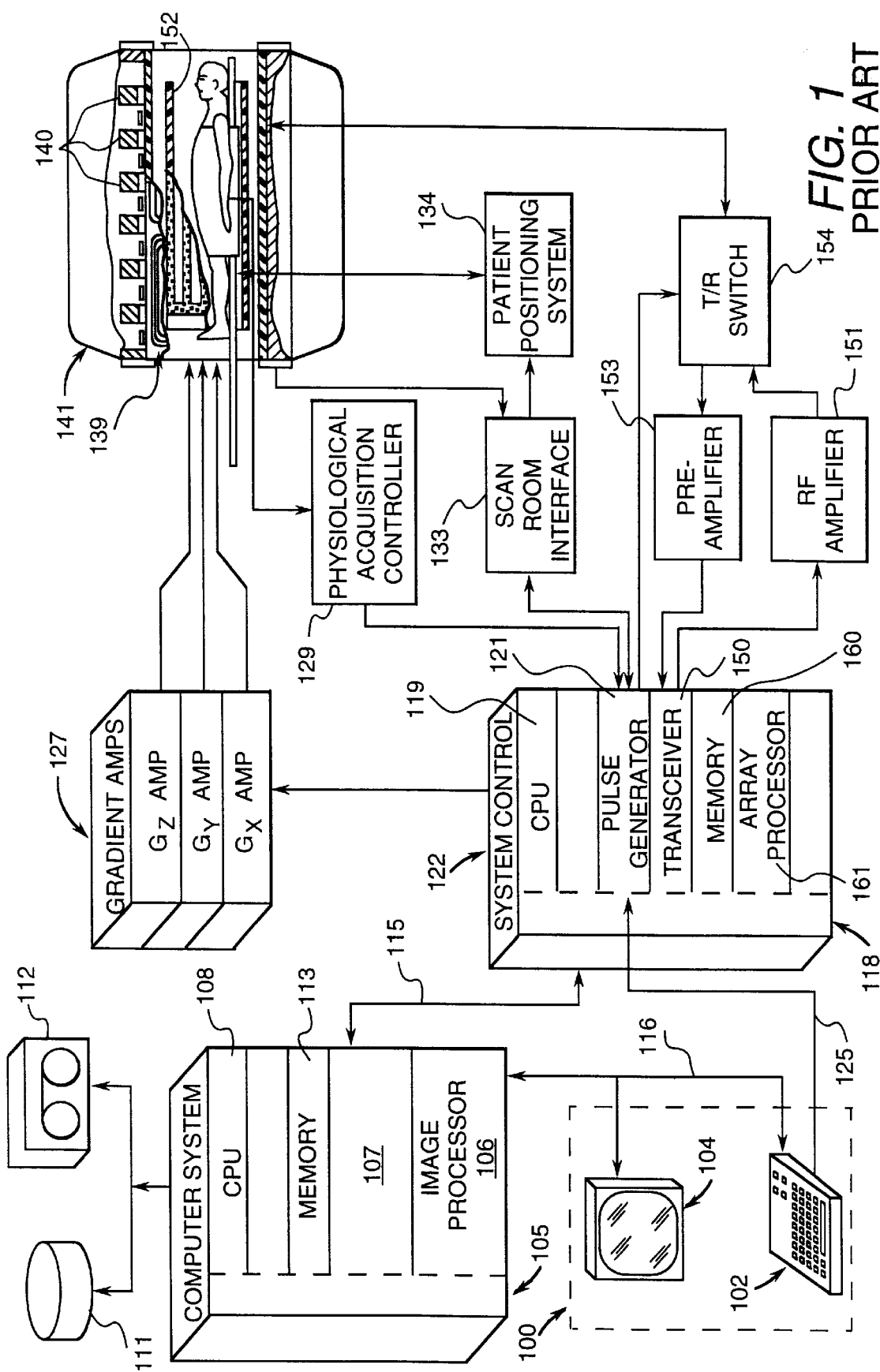
FIG. 1 is a block diagram of an MRI system employing the invention.

FIG. 1 illustrates the major components of a preferred MRI system which incorporates the present invention.

Operation of the system is controlled from an operator console 100 which includes a keyboard and control panel 102 and a display screen 104. Console 100 communicates through a link 116 with a separate computer system 107 that enables an operator to control the production and display of images on screen 104. Computer system 107 includes an image processor module 106, a CPU (central processing unit) module 108 and a memory module 113, known in the art as a frame buffer for storing image data arrays. These modules communicate with each other through a backplane 105. Computer system 107 is linked to a disk storage 111 and a tape drive 112 for storage of image data and programs, and communicates with a separate system control 122 through a high speed serial link 115.

System control 122 comprises a set of modules interconnected by a backplane 118, and which include a CPU module 119 and a pulse generator module 121 coupled to operator console 100 through a serial link 125. System control 122 receives, through link 125, commands from the operator which determine the scan sequence that is to be performed.

Pulse generator module 121 operates the system components to carry out the desired scan sequence, and produces data that determine the timing, strength and shape of the RF (radio frequency) pulses which are to be produced, and the timing and length of the data acquisition window. The pulse generator module is coupled to a set of gradient amplifiers 127 to control the timing and shape of the gradient pulses to be produced during the scan. Pulse generator module 121 also receives patient data from a physiological acquisition controller 129 that receives signals from a number of different sensors attached to the patient, such as ECG (electrocardiograph) signals from electrodes. As described below, pulse generator module 121 is responsive to detection of an R-wave in the ECG signals to perform a pulse sequence that acquires NMR data. Pulse generator module 121 is coupled to a scan room interface circuit 133 which receives signals from various sensors associated with the condition of the patient and the magnet system. A patient positioning system 134 receives commands through scan room interface circuit 133 to move the patient to the desired position for the scan.

The gradient waveforms produced by pulse generator module 121 are applied to gradient amplifiers 127 comprised of $G_x$, $G_y$ and $G_z$ amplifiers. Each gradient amplifier excites a corresponding gradient coil in an assembly 139 to produce the magnetic field gradients used for position encoding acquired signals. Gradient coil assembly 139 forms part of a magnet assembly 141 which includes a polarizing magnet 140 and a whole-body RF coil 152.

A transceiver module 150 in system control 122 produces RF pulses which are amplified by an RF amplifier 151 and coupled to RF coil 152 by a transmit/receive switch 154. Frequency content and amplitude of these RF pulses can be precisely controlled to selectively excite spins under direction of the pulse sequence being performed by pulse generator module 121. The resulting NMR signals radiated by the excited nuclei in the patient may be sensed by RF coil 152 and coupled through transmit/receive switch 154 to a preamplifier 153. The amplified NMR signals are demodulated, filtered, and digitized in the receiver section of transceiver 150. Transmit/receive switch 154 is controlled by a signal from pulse generator module 121 to electrically couple RF amplifier 151 to coil 152 during the transmit mode and to preamplifier 153 during the receive mode. Transmit/receive switch 154 also enables a separate RF coil (for example, a head coil or surface coil) to be used in either the transmit or receive mode.

The NMR signals picked up by RF coil 152 and digitized by transceiver module 150 are transferred to a memory module 160 in system control 122. When the scan is completed and an entire array of data has been acquired in memory module 160, an array processor 161 operates to Fourier-transform the data. The processed data are conveyed through serial link 115 to computer system 107 where they are stored in disk storage 111. In response to commands received from operator console 100, these data may be archived on tape drive 112, or may be further processed by image processor 106, conveyed to operator console 100 and presented on display 104.

Figure 2:
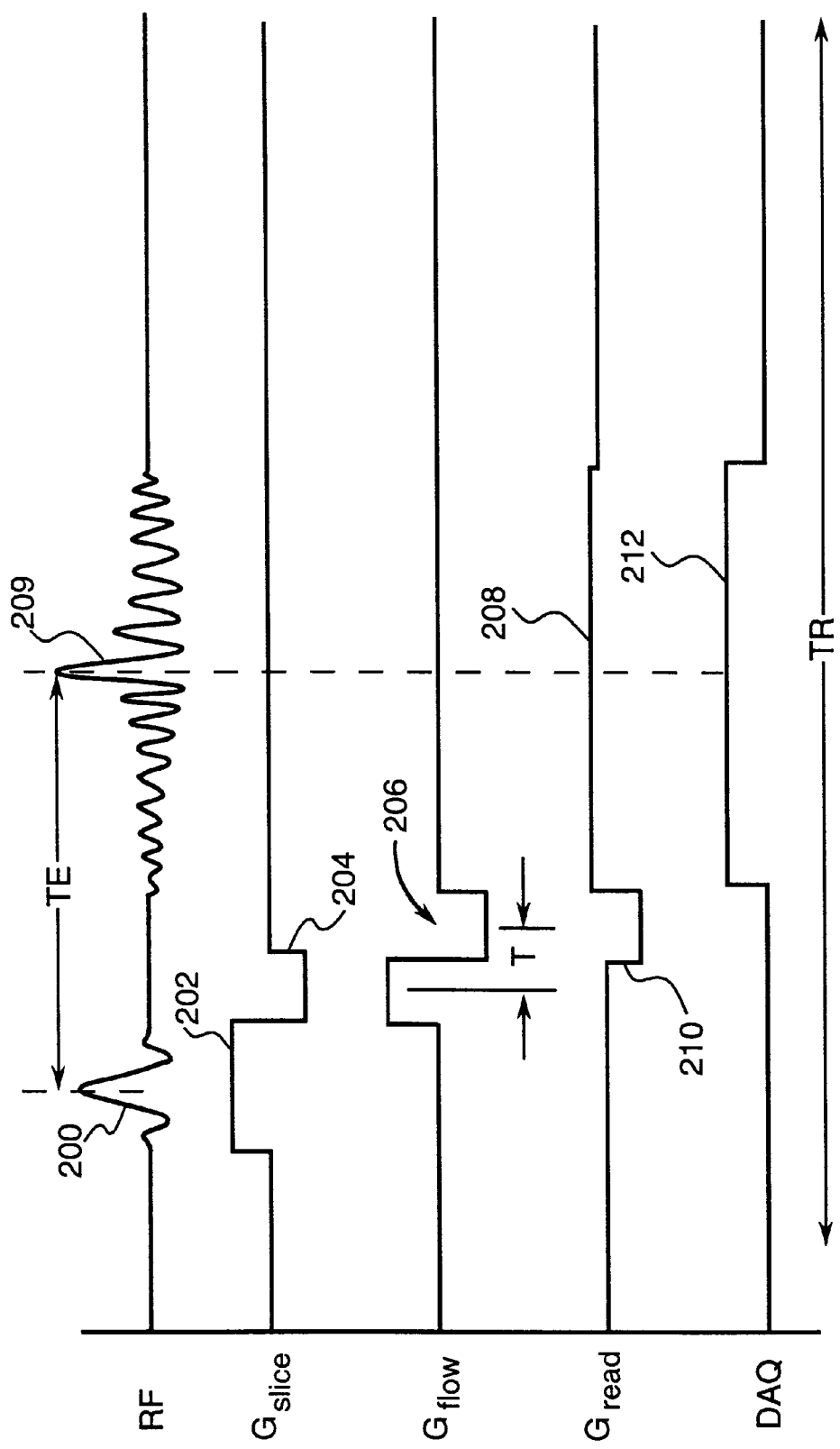
FIG. 2 is a graphic representation of a preferred embodiment of pulse sequences used by the MRI system of FIG. 1 to practice the invention.

In FIG. 2, the preferred embodiment of a pulse sequence used to practice the invention is shown to include a selective RF excitation pulse 200 which is applied in the presence of a slice select gradient pulse 202. Although use of selective RF excitation pulses is well known in the art for nutating longitudinal magnetization to produce transverse magnetization in a selected single slice, RF excitation pulse 200 is substantially different in that it contains two separate bands of frequencies rather than one. As a result, two separate slices are simultaneously excited at locations $Z_1$ and $Z_2$ along the slice select gradient axis. A flip angle of from 30° to 120° is preferred for each slice. As with conventional MR imaging, a refocusing gradient pulse 204 is applied after the slice select gradient pulse 202 to remove phase dispersion of the transverse magnetization in the two excited slices.

After excitation, a bipolar flow encoding gradient pulse 206 is applied along a flow encoding gradient axis. This flow encoding gradient pulse has two lobes of equal integrated area $A_g$, but opposite polarity. As a result, a phase shift $\theta_{flow}$ proportional to spin velocity is induced in the transverse magnetization (and higher orders of motion) along the flow encoding gradient axis. This phase shift is expressed as follows:

$$\theta_{flow} = \gamma V T A_g \qquad (2)$$

where $\gamma$ is the gyromagnetic ratio of the nuclear spins, V is spin velocity along the flow encoding gradient axis, T is the time duration between the centers of the two lobes of the bipolar gradient pulse 206, and $A_g$ is the integrated area under each lobe.

After the transverse magnetization is flow encoded, a frequency-encoding, or readout, gradient pulse 208 is applied. To realign the transverse magnetization at a selected peak echo time TE, a readout dephasing gradient pulse 210 of opposite polarity is applied before the readout gradient pulse 208. In the preferred embodiment, the area of dephasing pulse 210 is one-half the area of readout gradient pulse 208 and an NMR echo signal 209 peak thus occurs at the center of readout gradient pulse 208.

NMR echo signal 209 is acquired simultaneously with application of readout gradient pulse 208 during a data acquisition window 212. Both the signal amplitude and phase are sampled during the data acquisition window, and the acquired data are stored in memory module 160 (FIG. 1). The acquired NMR echo signal 209 is Fourier-transformed along the single readout gradient axis to produce a one-dimensional spatial data set. It is the phase information in this one-dimensional spatial data set which is used, as described in more detail below.

Figure 3:
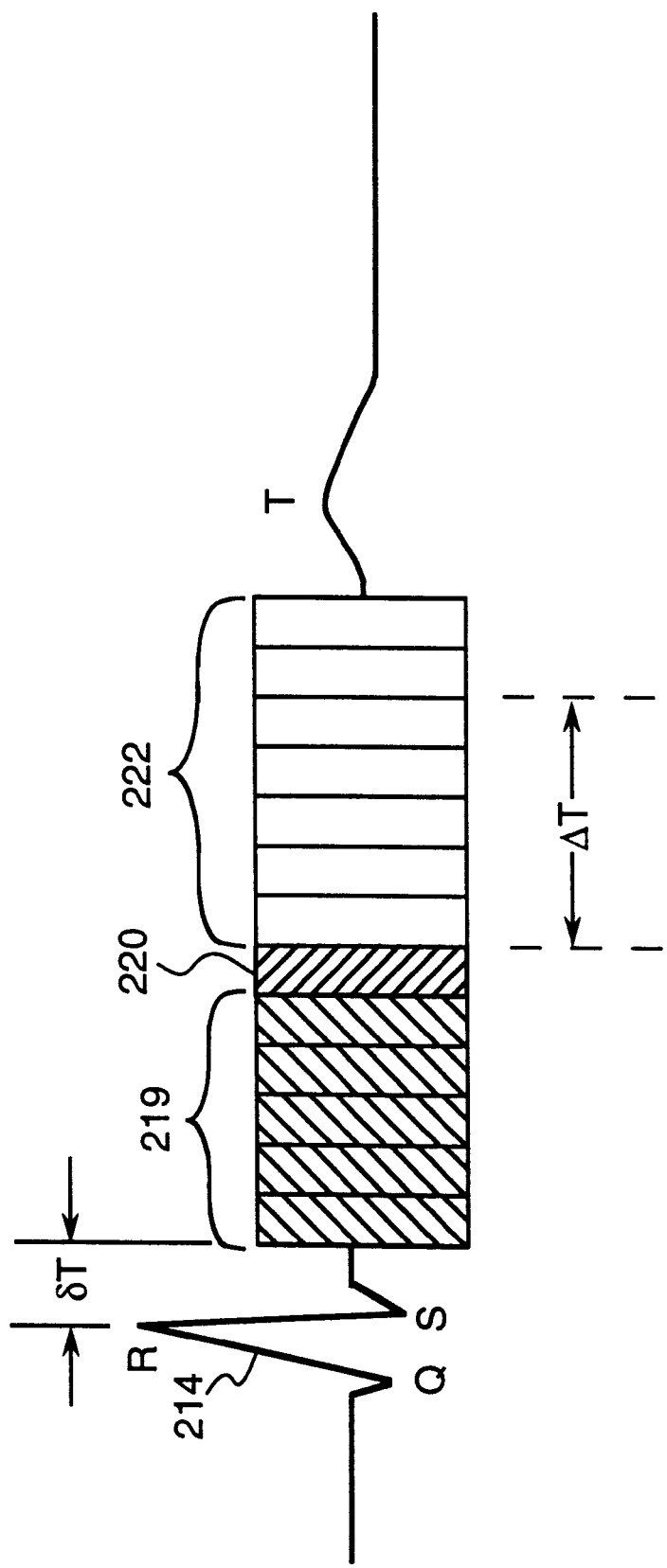
FIG. 3 is a graphic representation of how the data acquisition using the pulse sequence of FIG. 2 is coordinated with a patient's ECG signal.

Acquisition of NMR data is synchronized with the patient's heart beat so that the surge in blood flow velocity through the target blood vessel can be detected. The R-wave 214 of the ECG signal, shown in FIG. 3, produces a cardiac gating signal to pulse generator module 121 (FIG. 1) and, at a selected time interval δT thereafter, a set of disdaq pulse sequences 219, a reference pulse sequence 220 and a set of data acquisition pulse sequences 222 are performed. Data acquisition pulse sequences 222 are identical to the pulse sequence of FIG. 2 and are performed as fast as possible for an interval ΔT between successive R-waves 214. Reference pulse sequence 220 is the same as the pulse sequence of FIG. 2 with one exception—the polarity of bipolar flow encoding gradient 206 is reversed or, in the alternative, is turned off. The phase of the Fourier transformed reference NMR echo signal is subtracted from the phase of each one-dimensional spatial data set produced by pulse sequences 222. This subtracts from each one-dimensional spatial data set any phase shifts caused by factors other than spin motion along the flow-encoding gradient axis.

The disdaq pulse sequences 219 are the same as the pulse sequence of FIG. 2, with two exceptions. First, no flow encoding gradient 206 is applied, and second, no NMR data are acquired. A selected number (e.g. 4 to 20) of disdaq pulse sequences 219 are performed to cause the longitudinal magnetization of the spins in the excited slices to reach a steady state condition. This insures that the reference data acquired with the subsequent reference pulse sequence 220 are accurate.

In a preferred embodiment, each data acquisition pulse sequence 222 has a TR (temporal resolution) of 10 msecs. As a result, if all the measurements are made during one cardiac cycle, arrival of the blood surge at each of the two excited slices 252 and 254 can be measured with a resolution of 10 msecs. When higher resolutions are required, however, the measurement sequence depicted in FIG. 3 and described above may be repeated in subsequent cardiac cycles, but with different time delays δT between the R-wave detection and the start of the measurement sequence. Thus, by extending the data acquisition over several cardiac cycles, greater temporal resolution and hence more accurate wave speed measurement can be obtained, as shown in Table 1.

TABLE 1

| Number of heartbeats during acquisition | Temporal Resolution (TR = 10 ms) |
|---|---|
| 1 | 10 ms |
| 2 | 5 ms |
| 5 | 2 ms |
| 10 | 1 ms |
| 20 | 0.5 ms |

Figure 4:
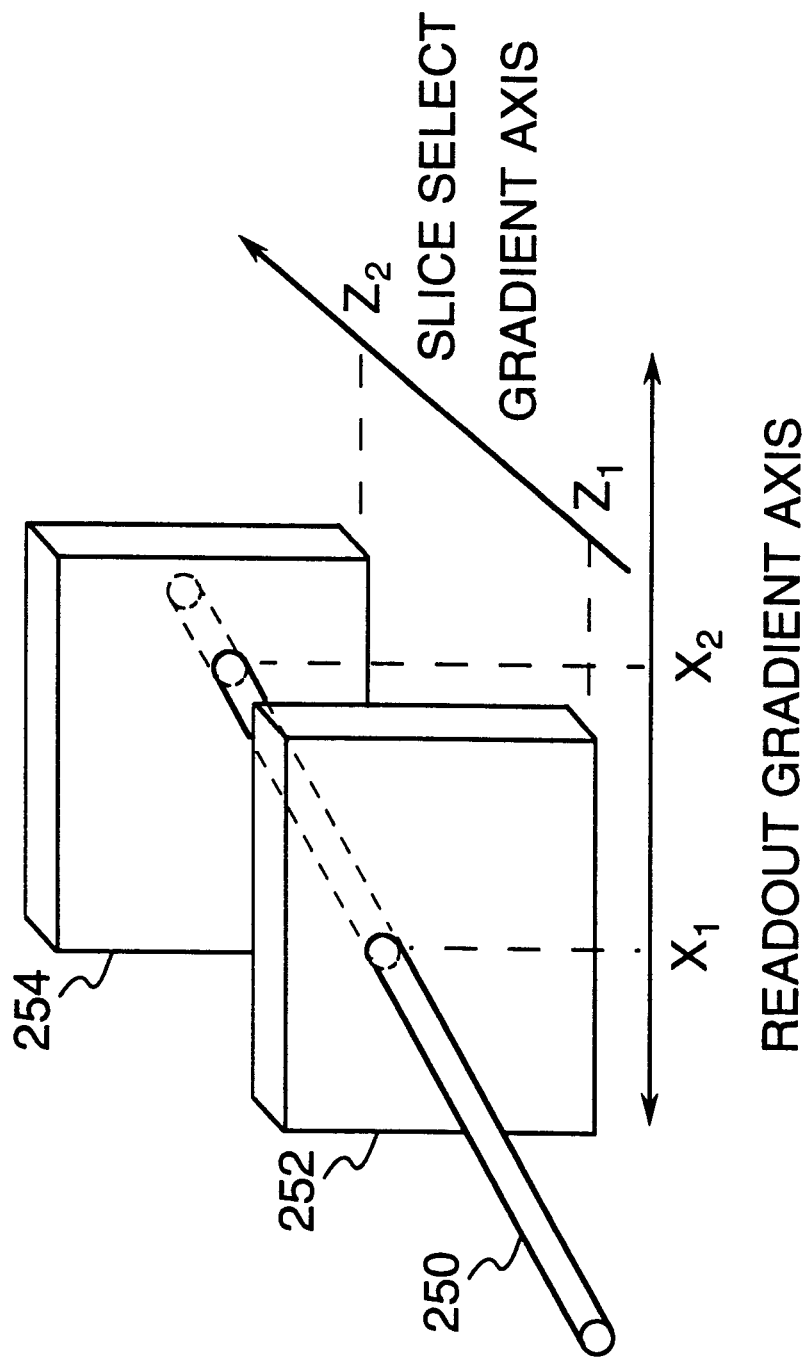
FIG. 4 is a schematic representation of two slices from which NMR signals are acquired using the pulse sequence of FIG. 2.
Figure 5:
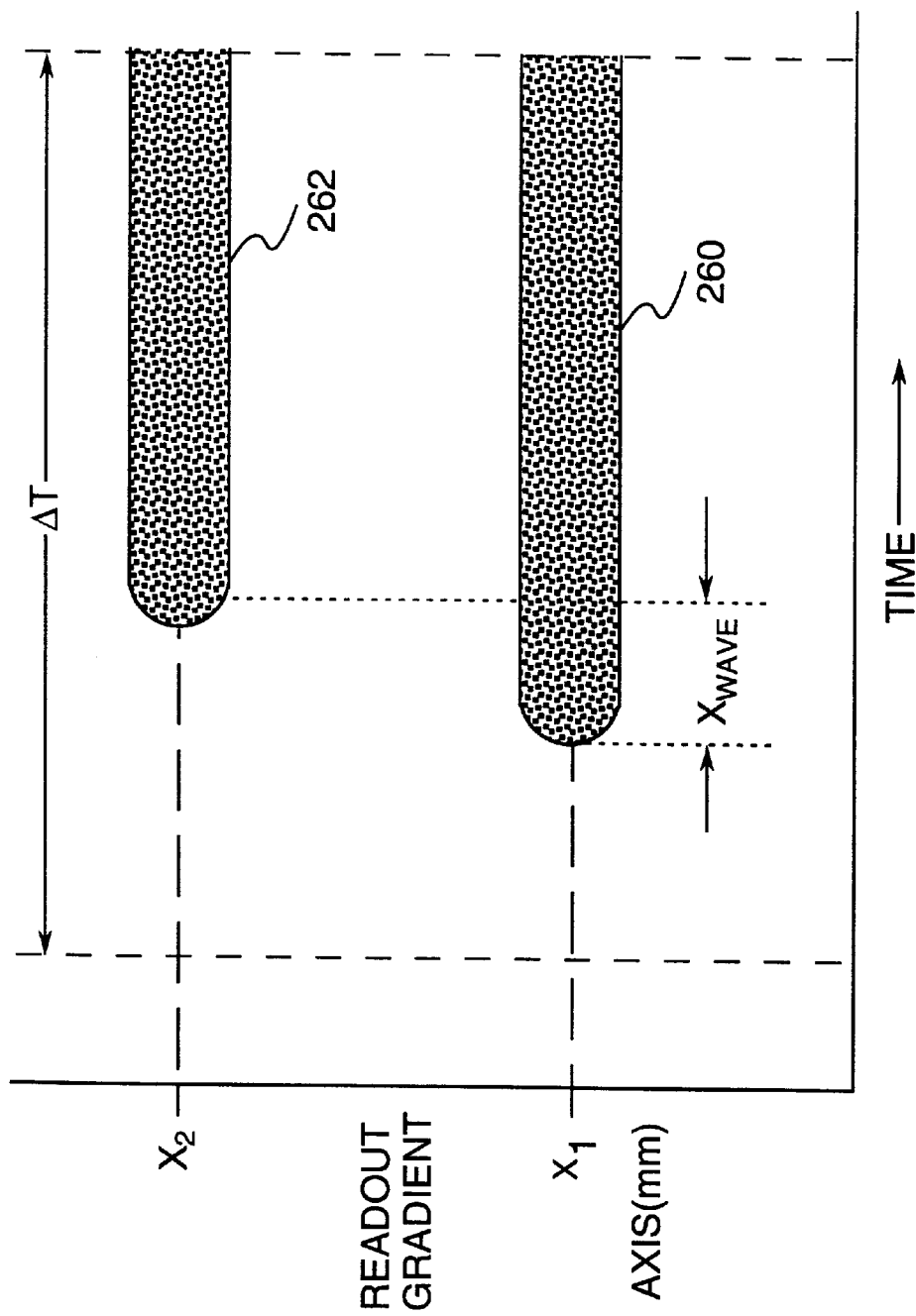
FIG. 5 is a graphic display produced from the acquired NMR signals when processed according to the invention.

With reference to FIGS. 4 and 5, measurement of wave velocity in a blood vessel 250 is made by measuring the time interval $T_{wave}$ between arrival of the blood surge at a first slice 252 located at $Z_1$ and a second slice 254 located at $Z_2$. This arrival is detected by a sudden increase in blood flow velocity which increases the phase shift $\theta_{flow}$ in the acquired NMR signal, as discussed above. The gradient axes are aligned such that slices 252 and 254 are not orthogonal to blood vessel 250 and, as a result, blood vessel 250 intersects each slice 252 and 254 at a different location $X_1$ and $X_2$ along the readout gradient axis. The flow encoding gradient 206 (FIG. 2) in the measurement pulse sequence is set parallel to the path of blood vessel 250, and when blood surge arrives at slice 252, the phase shift of the one-dimensional spatial data set will increase at the readout gradient axis location $x_1$. Since the blood velocity remains high during the remainder of acquisition interval ΔT, this phase shift also occurs at subsequently-acquired one-dimensional spatial data sets. This is indicated in FIG. 5 by phase image 260.

The same surge of blood flow reaches the second slice 254 a short time later, as indicated by phase image 262 in FIG. 5. When the increase in spin velocity reaches the second slice 254, an increase in phase shift is seen in the one-dimensional spatial data set at the readout gradient axis location $x_2$. This phase shift remains for the rest of the acquisition interval ΔT.

The wave propagation velocity in blood vessel 250 is determined by measuring the time interval TWAVE between the blood surge reaching the first slice 252 and reaching the second slice 254. Time interval TWAVE is measured as shown in FIG. 5 by manually or automatically detecting the leading edges of the two phase images 260 and 262 and measuring the time interval TWAVE therebetween. Wave velocity (c) is calculated by dividing this time interval into the distance (d) between the two slice intersection points, where $$d=\sqrt{(X_2-X_1)^2+(Z_2-Z_1)^2}. \qquad (3)$$

The wave propagation velocity (c) in the blood vessel 250 is thus calculated as follows:

$$c=d/T_{WAVE}$$

The distensibility D of blood vessel 250 is then calculated using the above equation (1).

In the preferred embodiment described above, a pulse sequence is used which can rapidly acquire NMR data from which the distensibility of a blood vessel can be accurately measured. No phase encoding gradients are employed and this considerably shortens the data acquisition process. While an ECG signal is employed to gate the data acquisition during each cardiac cycle, other gating means such as a plythsmograph or a Doppler ultrasound system may alternatively be employed. A gradient recalled echo data acquisition is used in the preferred embodiment because of its short TR; however, a spin echo signal may also be acquired. Signal averaging can be used to increase SNR (signal-to-noise ratio) by repeating acquisitions at the same time delay δT on successive cardiac cycles.

The invention may be extended to excite more than two slices during each pulse sequence. This would permit the computation of reflected pressure waves as well as the primary, forward moving wave.

In a preferred embodiment, a single reference pulse sequence 220 is performed prior to each set of data acquisition pulse sequences 222. In the alternative, a reference pulse sequence 220 may be interleaved such that each data acquisition pulse sequence 222 has its own reference signal. This improves accuracy of the signal phase measurement, but reduces the measurement resolution or requires a longer data acquisition process. A set of reference pulse sequences 220 can also be performed in a separate cardiac cycle at the identical time delay δT as the corresponding set of data acquisition pulse sequences 222.

An alternative embodiment of the invention may be used in clinical applications where blood flow through the vessel of interest is very slow, or stopped, and is followed by a sudden surge of blood (e.g. systole). In such applications, flow encoding gradient 206 may not be required. In addition to removing flow encoding gradient 206 from the pulse sequence of FIG. 2, the flip angle of the RF excitation pulse 200 is set relatively high to cause spin saturation during the interval ΔT. When fresh, unsaturated spins surge into the respective slices 252 and 254, shown in FIG. 4, the amplitude of the acquired NMR signals increases by a substantial and detectable amount. An image such as that shown in FIG.

5 may thus be produced, where the objects 260 and 262 are amplitude images rather than phase images. The analysis of these images to calculate distensibility is the same as that described above.

While only certain preferred features of the invention have been illustrated and described, many modifications and changes will occur to those skilled in the art. It is, therefore, to be understood that the appended claims are intended to cover all such modifications and changes as fall within the true spirit of the invention.

What is claimed is:

1. A method for measuring compliance of a blood vessel in a subject, comprising the steps of:
   a) positioning the subject in a polarizing magnetic field;
   b) generating an RF excitation pulse in the presence of a slice select gradient pulse to produce transverse magnetization in two slices which are spaced apart and which intersect the blood vessel at a non-orthogonal angle;
   c) producing a readout gradient pulse and acquiring an NMR signal produced by the transverse magnetization in both slices;
   d) repeating steps b) and c) over an interval $\Delta T$ during which a wave motion propagates along the blood vessel and through said two slices;
   e) transforming the NMR signals to produce a corresponding number of one-dimensional spatial data sets;
   f) analyzing the one-dimensional spatial data sets to detect the arrival of motion at each slice;
   g) calculating velocity of the wave motion along the blood vessel as the wave motion propagates through said slices; and
   h) calculating the compliance of the blood vessel from the calculated wave motion velocity.

2. The method as recited in claim 1 wherein a flow encoding gradient is produced after step b) and prior to step c), and the flow encoding gradient is substantially aligned with the direction of the blood vessel at intersections of the blood vessel with the two slices.

3. The method as recited in claim 2 wherein the flow encoding gradient is bipolar.

4. The method as recited in claim 1 wherein the interval $\Delta T$ occurs during one cardiac cycle of the subject's heart.

5. The method as recited in claim 1, and further including the step of producing a cardiac gating signal that indicates the subject's heart beat, and wherein the start of the interval $\Delta T$ during which steps a)–c) are performed is triggered by the cardiac gating signal.

6. The method as recited in claim 5 wherein the interval $\Delta T$ begins at a delay interval $\delta T$ following the cardiac gating signal.

7. The method as recited in claim 6 wherein the interval $\Delta T$ occurs over a plurality of subject heart beats and the delay interval $\delta T$ is changed for each heart beat.

8. The method as recited in claim 2 wherein step d) includes the step of:
   performing a one-dimensional Fourier transformation of each NMR signal.

9. The method as recited in claim 8 wherein step d) further includes the step of:
   calculating the phase of the Fourier transformed NMR signal.

10. The method as recited in claim 9 wherein step f) includes the step of:
    detecting a change in phase of the transformed NMR signal from each of said slices.

11. The method as recited in claim 9, and further including the steps of:
    performing a reference pulse sequence comprised of steps b) and c) using a second flow encoding gradient to produce a reference NMR signal; and
    correcting the phase of a Fourier-transformed NMR signal using phase information derived from the reference NMR signal.

12. The method as recited in claim 11 wherein the second flow encoding gradient is zero.

13. The method as recited in claim 11 wherein the flow encoding gradient is a bipolar gradient and the second flow encoding gradient is a bipolar gradient of opposite polarity.

14. A system for measuring velocity of wave propagation through a blood vessel in a subject, comprising:
    a magnet assembly for producing a polarizing magnetic field in the subject;
    a gradient field assembly for producing magnetic field gradients in the subject;
    a transceiver for producing an RF magnetic field in the subject and for acquiring an NMR signal produced by transversely magnetized spins in the subject;
    a pulse generator for operating the gradient field assembly and the transceiver to perform a series of pulse sequences during an interval $\Delta T$ in which the wave propagates through the blood vessel, each pulse sequence including:
      a) applying an RF excitation pulse in the presence of a slice select magnetic field gradient pulse to produce transverse magnetization simultaneously in two spaced slices which are intersected by the blood vessel,
      b) flow-encoding the transverse magnetization by applying a flow encoding magnetic field gradient pulse, and
      c) acquiring NMR signals simultaneously from both of said slices in the presence of a readout magnetic field gradient;
    a central processing unit for processing the acquired NMR signals to detect arrival time of the wave at each slice location; and
    a computer system for calculating the wave velocity based on the detected arrival times and the spacing of the two slices.

15. The system as recited in claim 14, and further including:
    an array processor for Fourier-transforming each acquired NMR signal; and
    a memory for storing acquired NMR signals.

16. The system as recited in claim 15, and further including:
    an array processor for detecting a change in phase of the Fourier-transformed NMR signal at locations along said readout magnetic field gradient axis corresponding to the intersections of the blood vessel and each of said slices.

17. The system as recited in claim 14 wherein the flow encoding magnetic field gradient pulse is directed in substantially the same direction as the blood vessel at intersections of the blood vessel with the two slices.

18. The system as recited in claim 17 wherein the flow encoding magnetic field gradient pulse is bipolar.

19. The system as recited in claim 14 wherein the pulse generator is also operable to perform a series of disdaq pulse sequences prior to the interval $\Delta T$, each disdaq pulse sequence including an RF excitation pulse in the presence of a slice select magnetic field gradient to produce transverse magnetization simultaneously in said two spaced slices.

* * * * *